United States Patent
Miller et al.

[11] Patent Number: 6,025,265
[45] Date of Patent: *Feb. 15, 2000

[54] METHOD OF FORMING A LANDING PAD STRUCTURE IN AN INTEGRATED CIRCUIT

[75] Inventors: Robert Otis Miller; Gregory Clifford Smith, both of Carrollton, Tex.

[73] Assignee: STMicroelectronics, Inc., Carrollton, Tex.

[*] Notice: This patent is subject to a terminal disclaimer.

[21] Appl. No.: 08/989,953

[22] Filed: Dec. 12, 1997

Related U.S. Application Data

[63] Continuation of application No. 08/577,565, Dec. 22, 1995, Pat. No. 5,719,071.

[51] Int. Cl.$^7$ .................. H01L 21/3205; H01L 21/4763; H01L 21/44

[52] U.S. Cl. .................. 438/634; 438/629; 438/656; 438/657; 438/666; 438/684; 438/592

[58] Field of Search .................................. 438/634, 652, 438/653, 656, 657, 629, 666, 684, 592

[56] References Cited

U.S. PATENT DOCUMENTS

| | | | |
|---|---|---|---|
| 4,106,051 | 8/1978 | Dormer et al. | 357/71 |
| 4,441,247 | 4/1984 | Gargini et al. | 437/193 |
| 4,707,457 | 11/1987 | Erb | 437/193 |
| 4,782,030 | 11/1988 | Katsumata et al. | 437/33 |
| 4,789,885 | 12/1988 | Brighton et al. | 437/193 |
| 4,810,666 | 3/1989 | Taji | 437/30 |
| 4,822,749 | 4/1989 | Flanner et al. | 437/193 |
| 4,844,776 | 7/1989 | Lee et al. | 156/653 |
| 4,868,138 | 9/1989 | Chan et al. | 437/44 |
| 4,908,332 | 3/1990 | Wu | 437/193 |
| 4,916,397 | 4/1990 | Masuda et al. | 357/71 |
| 4,922,311 | 5/1990 | Lee et al. | 357/23 |
| 4,984,056 | 1/1991 | Fujimoto et al. | 357/71 |
| 4,997,790 | 3/1991 | Woo et al. | 437/195 |
| 5,036,378 | 7/1991 | Lu et al. | 357/23.5 |
| 5,071,783 | 12/1991 | Taguchi et al. | 437/52 |
| 5,110,752 | 5/1992 | Lu | 437/47 |
| 5,158,910 | 10/1992 | Cooper et al. | 437/195 |
| 5,210,429 | 5/1993 | Adan | 257/67 |

(List continued on next page.)

FOREIGN PATENT DOCUMENTS

| | | | |
|---|---|---|---|
| 0 369 336 A2 | 5/1990 | European Pat. Off. | H01L 21/90 |
| 0 499 433 A2 | 8/1992 | European Pat. Off. | H01L 21/90 |
| 62-136856 | 6/1987 | Japan | H01L 21/28 |
| 62-272555A | 11/1987 | Japan | H01L 21/88 |
| 89-304807 | 9/1989 | Japan | H01L 21/88 |
| 3-016220 | 1/1991 | Japan | H01L 21/3205 |
| 3-073531 | 3/1991 | Japan | H01L 21/3205 |
| 4-307732 | 10/1992 | Japan | H01L 21/90 |

OTHER PUBLICATIONS

Queirolo, et al, "Dopant Activation, Carrier Mobility and TEM Studies in Polycrystalline Silicon Films," J. Electrochem. Soc., v. 137 No. 3, pp. 967–970 (Mar. 1990).

Pai, et al, "Chemical Vapor Deposition of Selective Epitaxial Silicon Layers," J. Electrochem. Soc., v. 137 No. 3, pp. 971–976 (Mar. 1990).

Cleeves et al, "A Novel Disposable Post Technology for Self–Aligned Sub–Micron Contacts," 1994 Symposium on VLSI Technology Digest of Technical Papers, pp. 61–62.

Broadbent et al, "Selective Low Pressure Chemical Vapor Deposition of Tungsten," J. Electrochem. Soc., v. 131 No. 6, pp. 1427–1433 (Jun. 1984).

*Primary Examiner*—John F. Niebling
*Assistant Examiner*—Ha Tran Nguyen
*Attorney, Agent, or Firm*—Theodore E. Galanthay; Lisa K. Jorgenson; Dan Venglarik

[57] ABSTRACT

A method is provided for forming a landing pad of a semiconductor integrated circuit, and an integrated circuit formed according to the same. A plurality of conductive regions are formed over a substrate. A polysilicon landing pad is formed over at least one of the plurality of conductive regions. After the polysilicon is patterned and etched to form the landing pad, tungsten is then selectively deposited over the polysilicon to form a composite polysilicon/tungsten landing pad which is a good etch stop, a good barrier to aluminum/silicon interdiffusion and a good conductor.

17 Claims, 5 Drawing Sheets

U.S. PATENT DOCUMENTS

| | | | |
|---|---|---|---|
| 5,219,789 | 6/1993 | Adan | 432/192 |
| 5,229,326 | 7/1993 | Dennison et al. | 437/195 |
| 5,247,199 | 9/1993 | Matlock | 257/371 |
| 5,275,972 | 1/1994 | Ogawa et al. | 437/195 |
| 5,298,463 | 3/1994 | Sandhu et al. | 437/200 |
| 5,298,792 | 3/1994 | Manning | 257/758 |
| 5,308,795 | 5/1994 | Hawley et al. | 437/195 |
| 5,316,976 | 5/1994 | Bourg, Jr. et al. | 437/195 |
| 5,359,226 | 10/1994 | DeJong | 257/773 |
| 5,420,058 | 5/1995 | Lee et al. | 437/41 |
| 5,491,100 | 2/1996 | Lee et al. | 438/279 |
| 5,514,622 | 5/1996 | Bornstein et al. | 437/190 |
| 5,674,782 | 10/1997 | Lee et al. | 438/592 |
| 5,691,235 | 11/1997 | Meikle et al. | 438/680 |
| 5,719,071 | 2/1998 | Miller et al. | 438/612 |

METHOD OF FORMING A LANDING PAD STRUCTURE IN AN INTEGRATED CIRCUIT

This is a Continuation of application Ser. No. 08/577,565, filed Dec. 22, 1995, now U.S. Pat. No. 5,719,071.

1. Field of the Invention

The present invention relates generally to semiconductor integrated circuit processing, and more specifically to an improved method of forming an interconnect and landing pad structure in an integrated circuit.

2. Background of the Invention

Design rules are required in integrated circuit design which allow for variations in the fabrication processes to protect against catastrophic failures and to guarantee the electrical parameters of the devices; the electrical parameters being related to the physical dimensions of the features. Certain feature sizes and minimum space or design tolerance must be maintained between devices in order to maintain the electrical integrity of the devices. Shapes and sizes may vary as a result of, for example, mask misalignment or variations in photoresist exposure. Design rules have thus been established for the various types of material used and the particular location of the devices on the chip. For example, width and spacing rules exist for metal, diffusion and polysilicon materials as well as for contact openings such as a metal contact space to gate. Any misalignment in the formation of a metal contact, for example to a diffused region, may invade the required space between the contact and a surrounding device such as the polysilicon gate. Thus, reduction in the minimum required spacing will not necessarily meet the design tolerance for a given type of material and location and will not insure the devices' electrical characteristics.

To avoid the problems caused by a metal contact when misalignment or other spacing problems occur between, for example, the metal contact and gate, a landing pad may be formed between the metal contact and an underlying diffused region. Typically, the landing pad is formed from a doped polysilicon layer over which a silicide layer may be formed to decrease sheet resistance to tolerable levels. Due to the less stringent design rules for polysilicon for the contact space to gate, the landing pad allows for a reduction in the size of the cell and tolerates greater misalignment problems.

One problem encountered, however, with conventional landing pads is that the landing pad must be a good etch stop when etching the contact opening to the landing pad. The conventional landing pad, particularly when a silicide is formed over the polysilicon, is not a good etch stop for the contact etch. The etch chemistries used to etch the landing pad are not selective enough over surrounding oxides and the contact opening made to the landing pad must be severely narrowed by the respective etch chemistries to maintain the integrity of the contact opening.

An additional problem encountered in the field of integrated circuit manufacture, particularly with the continuing trend toward smaller integrated circuit feature sizes, is the making of high-reliability conductive electrical contacts between metallization layers and semiconductor elements, particularly contacts between aluminum and diffused junctions into single-crystal silicon. This increased difficulty is due to the tendency for aluminum and silicon to interdiffuse when in contact with one another, and when subjected to the high temperatures necessary for integrated circuit manufacturing. As is well known in the art, conventional integrated circuit process steps can cause silicon from the substrate to diffuse rather rapidly into pure aluminum in an attempt to satisfy the solubility of silicon in aluminum. The silicon exiting the substrate is then replaced by the newly formed aluminum+silicon alloy. The diffusion back into the substrate of the aluminum+silicon alloy may diffuse to such a depth as to short out a shallow p-n junction in the silicon. This phenomenon is known as junction spiking. The use of silicon-doped aluminum in forming integrated circuit metallization, while preventing junction spiking, is known to introduce the vulnerability of the contact junction to the formation of silicon nodules thereat, such nodules effectively reducing the contact area, and thus significantly reducing the conductivity of the contact.

The doped polysilicon landing pad with an overlying silicide has been found to be an inadequate barrier to the aluminum/silicon interdiffusion problem. Accordingly, recent advances in the field of integrated circuit fabrication have been made by the introduction of an additional barrier layer at the aluminum-silicon interface. Conventionally, the barrier layer is a refractory metal material such as titanium-tungsten (TiW), or a refractory metal nitride such as titanium nitride (TiN). The barrier layer is formed at the contact location so as to be disposed between the silicon and the overlying aluminum layer. The additional barrier layer inhibits the interdiffusion of aluminum and silicon atoms, thus eliminating the problems of junction spiking and silicon nodule formation noted above.

While a barrier layer eliminates the problems associated with aluminum in direct contact with silicon, it is difficult to form a uniform barrier in contact openings that have a large aspect ratio such as that in contact with a landing pad. Even with today's deposition technology including chemical vapor deposition (CVD) and collimated sputtering, it is often hard to uniformly coat all sides in an opening, particularly in the corners of the openings. If the barrier layer is not thick enough, pin holes may result from inadequate coverage, resulting in the junction spiking problem noted above, to occur.

It is therefore an object of the present invention to provide a method of forming an integrated circuit with a landing pad that is an adequate etch stop layer.

It is a further object of the present invention to provide such a landing pad that is a good barrier to aluminum/silicon interdiffusion.

It is yet a further object of the present invention to provide such a landing pad that reduces or eliminates the need for an additional barrier layer.

It is yet a further object of the present invention to provide such a landing pad that tolerates misalignment of subsequently formed contact openings.

Other objects and advantages of the present method will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. A plurality of conductive regions is formed over a substrate wherein at least one conductive region comprises an active area in the substrate adjacent the conductive region. A doped polysilicon layer is formed over the integrated circuit, patterned and etched to form a polysilicon landing pad over the active area and a portion of the adjacent conductive region. Tungsten is then selectively deposited on the polysilicon landing pad to form a composite doped polysilicon/tungsten landing pad. A dielectric layer having an opening therethrough is formed over a portion of the landing pad wherein the opening is substantially over the active area. The composite landing pad is a good barrier to aluminum/silicon interdiffusion, provides a good etch stop and is a good conductor to the underlying active area. The distance between adjacent devices and the landing pad is minimized while maintaining the design rule criteria for submicron geometries using a polysilicon landing pad.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 4, and 6–7 are cross-sectional views of the fabrication of a semiconductor integrated circuit according to alternative embodiments of the present invention.

DETAILED DESCRIPTION OF THE PREFERRED EMBODIMENTS

Figure 1:
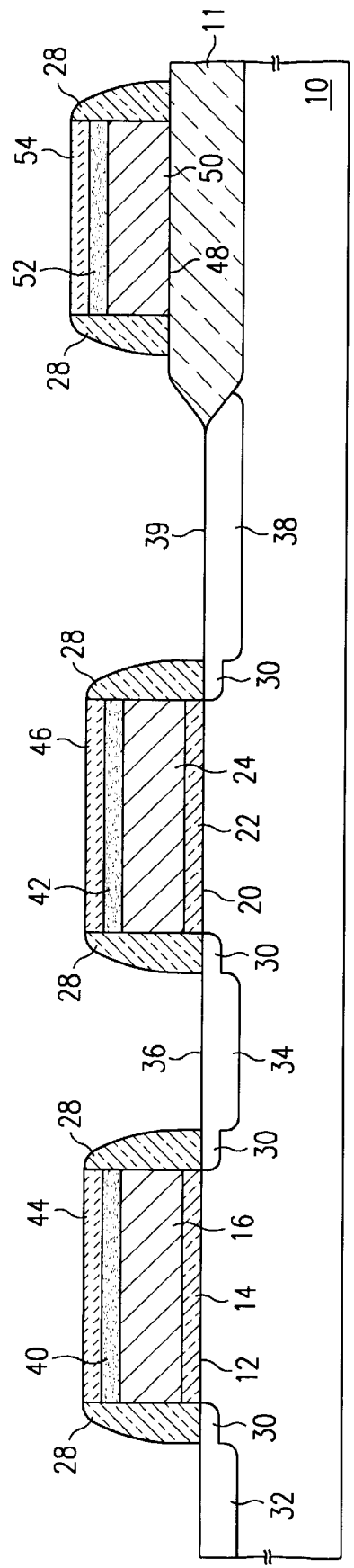
FIGS. 1–3, 5–6 and 8–9 are cross-sectional views of the fabrication of a semiconductor integrated circuit according to one embodiment of the present invention.
Figure 2:
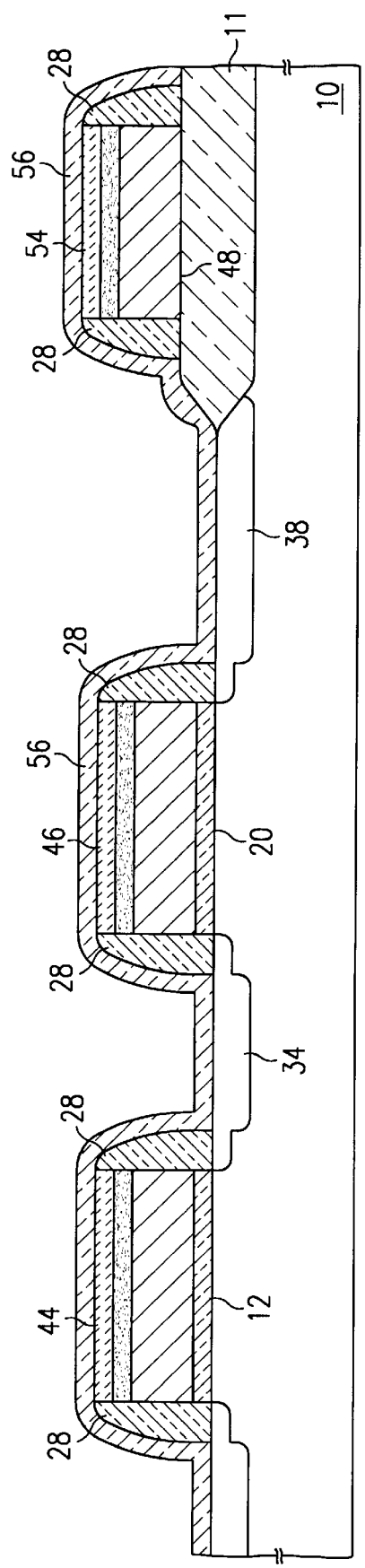
Figure 3:
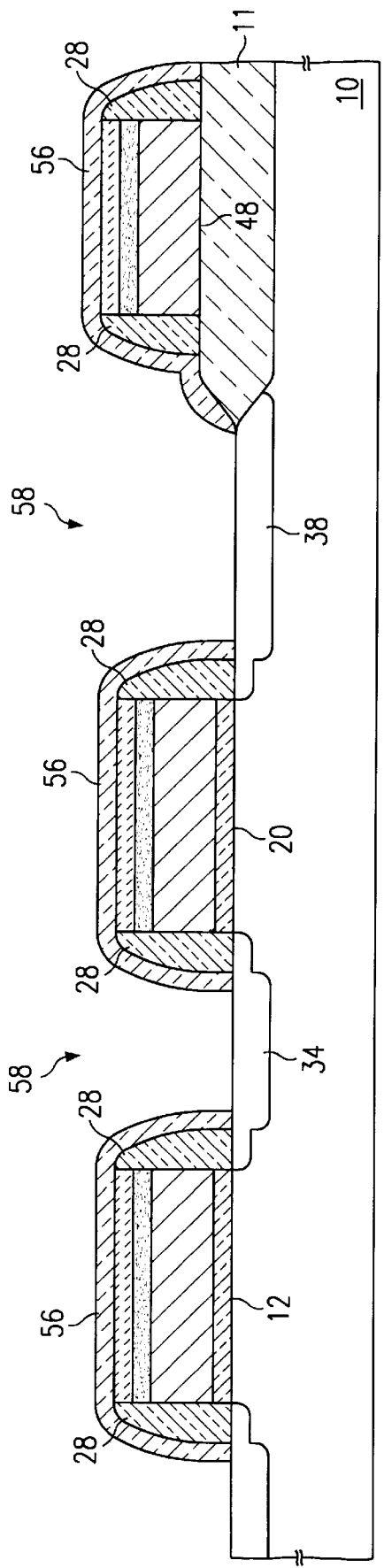

Referring now to FIGS. 1–3, a method of fabricating an integrated circuit to have a landing pad according to a first embodiment of the present invention will now be described in detail. The cross-sections of FIGS. 1–3 illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

FIG. 1 illustrates, in cross-section, a portion of an integrated circuit that has been partially fabricated. According to the example described herein, the present invention is directed to forming a landing pad between a metallization layer such as aluminum and a conductive region such as a doped semiconductor region in single-crystal silicon, as such contacts are generally the most sensitive to the misalignment and design rules for spacing addressed by the landing pad and the spiking and nodule problems addressed by the barrier layer. It is contemplated, of course, that the present invention will also be applicable to the formation of other contacts, including, for example, contacts between metallization and polysilicon.

The structure of FIG. 1, includes silicon substrate 10. Various active devices may be formed on or in the surface of the substrate as well as overlying any field oxide regions which may be formed to separate devices. In a particular application, substrate transistors 12 and 20 are shown having gate oxide layers 14 and 22, gate electrodes 16 and 24 overlying the gate oxide layers and typically formed from a first layer of polysilicon. As is known in the art, typically gate electrodes 16, 24 will have sidewall spacers 28, lightly doped drain regions 30 and source and drain or diffused regions 32, 34 shown for transistor 12 and diffused regions 34, 38 shown for transistor 20. Diffused or active region 34 may form a shared contact 36 between devices as is known in the art. In a particular application, diffused region 34 forms the source of one transistor and the drain of the adjacent transistor. Transistors 12, 20 may also have a silicide or polycide 40, 42, overlying the gate electrodes 16, 24 to reduce the sheet resistance of the gate electrodes. FIG. 1 also includes interconnect 48, shown having an interconnect line 50 overlying a field oxide region 11, which is typically formed from the first layer of polysilicon, which would also form the gate electrode of another transistor outside the plane of the drawing. Interconnect 48 typically will have sidewall spacers 28 and may have a polycide or silicide layer 52 as described above with reference to transistors 12, 20.

The diffused or active regions 34, 38 are formed of opposite conductivity type from that of substrate 10. For example, substrate 10 may be lightly doped p-type silicon and diffusion regions 34, 38 may be heavily doped n-type silicon. Of course, as noted above, other structures (with the same or opposite conductivity type selection) may alternatively be used; for example, substrate 10 may instead be a well or tub region in a CMOS process, into which diffusion or active regions 34, 38 are formed. In the example of FIG. 1, diffusion 34 is bounded by both substrate transistors 12, 20 and diffusion 38 is bounded by transistor 20 and field oxide region 11. In this example, diffusion 34 is very shallow, such as on the order of 0.15 microns, as is conventional for modern integrated circuits having sub-micron feature sizes. As such, diffusions 34, 38 may be formed by ion implantation of the dopant followed by a high-temperature anneal to form the junction, as is well known in the art. Alternatively, the ion implantation may be performed prior to the formation of subsequent layers, with the drive-in anneal performed later in the process, if desired.

In the preferred embodiment, transistors 12, 20 may also have a capping layer 44, 46, respectively and interconnect 48 may have a capping layer 54. The capping layer may be formed directly over the polysilicon gates or over the polycide. The capping layer is preferably an oxide or nitride formed to encapsulate the gate electrode as more fully described in United States patent application Ser. No. 08/331691 (Attorney's Docket No. 94-C-86/88) filed on Oct. 31, 1994 and incorporated herein by reference. The capping layer is preferably formed to a depth of between approximately 500 to 2000 angstroms over the polysilicon before the polysilicon is patterned and etched to form the gate electrodes. The capping layer may then be patterned and etched with the polysilicon to cap only the polysilicon remaining which forms the gate electrodes. The sidewall spacers may then be formed after the capping layer is formed to further encapsulate the gate electrodes and increase the tolerance for design rules and provide sufficient distance between the gate electrodes and subsequently formed conductive regions adjacent to the transistor gates.

Referring to FIG. 2, dielectric layer 56, which may be a deposited oxide or another suitable dielectric layer, is formed over diffusion regions 34, 38 and other already formed devices such as transistors 12, 20 and interconnect 48. Dielectric layer 56, formed for purposes of electrically isolating overlying conductive structures from diffusion 34 and other devices except at locations where contacts are desired therebetween, may have a thickness of between approximately 500 to 3000 angstroms.

Figure 4:
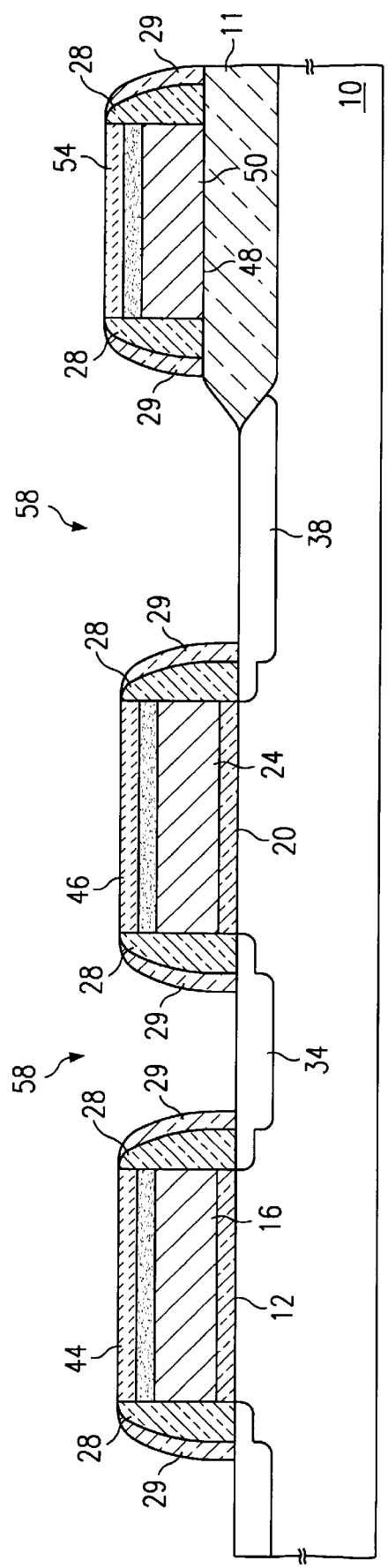

Referring to FIG. 3, contact openings 58 are formed through dielectric layer 56, for example by way of reactive ion etching or another type of anisotropic etching; as will be apparent below, this embodiment of the invention is concerned with the formation of an overlying landing pad that is in contact with diffusion regions 34, 38 and under an overlying metallization layer subsequently formed. Dielectric layer 56 is masked in order to primarily etch only opening 58 through layer 56. If dielectric layer 56 is etched without being masked, the upper surface of the layer is vertically etched essentially at the same rate as the opening. In this case, a second sidewall oxide spacer 29, as shown in FIG. 4, is formed along the sides of sidewall spacers 28. These second sidewall spacers 29 will provide for a self-aligned contact to be made to the active or diffused regions 34, 38 and will increase the distance between the edge of the gates 16, 24 and interconnect 50 and the edge of the contact openings 58. However, the distance from the top of the gates 16, 24 and interconnect 50 to an overlying layer will depend on the thickness of the remaining capping layers 44, 46 and 54, respectively.

With reference to FIG. 3, misalignment of the contact opening 58 over the diffused regions 34, 38, such as opening over the sidewall spacers 28, may decrease the contact space between the edge of gates 12, 20 and 48 and the side of the contact opening 58. Due to any misalignment of the contact opening, effectively opening over the sidewall spacers 28 or 29 of either transistor 12, 20 or interconnect 48, the thickness of the dielectric between these devices and subsequently formed metal contacts in the openings 58 may be reduced enough such that the design rules for a metal contact space to gate are not net and device yield may thus decrease. In addition, misalignment of the contact openings 58 increases the aspect ratio of the opening, increasing step coverage problems for a metal contact. To prevent any misalignment of the openings 58 from removing the sidewall spacers, these sidewall spacers 28 may be formed of nitride. In the preferred embodiment, a conductive material is formed in contact openings 58 whereby the design rules for contact space or side of contact 58 to edge of gates 12, 20 and interconnect 48 are met while enhancing the planarization of the surface topography to allow barrier layers and metal contacts to be uniformly formed.

Figure 5:
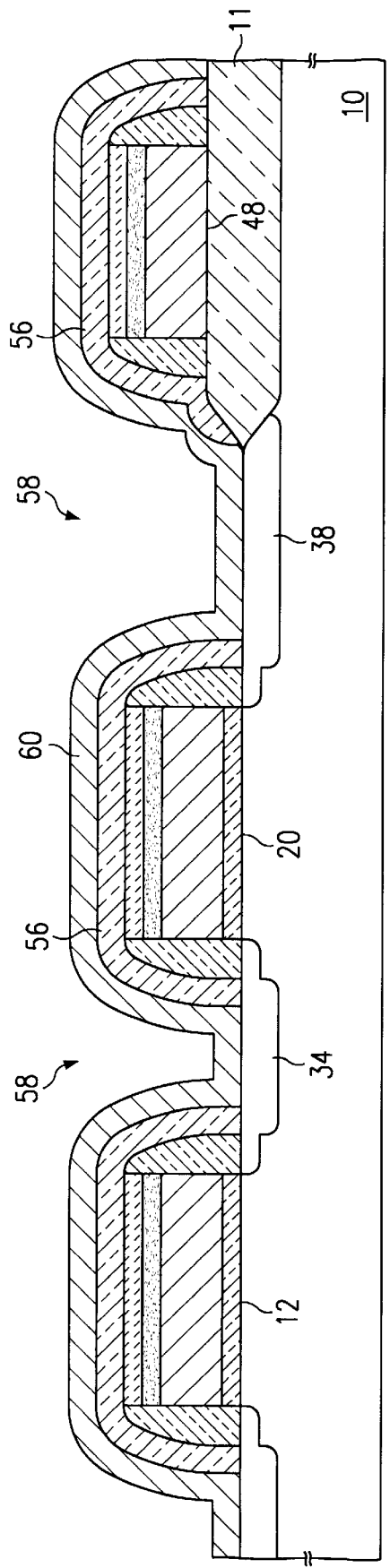

With reference to FIGS. 5–9, the present invention will be described following from FIG. 3. It will be appreciated, however, from those skilled in the art that this invention may be practiced with the second sidewall spacer as shown in FIG. 4. Referring now to FIG. 5, a polysilicon layer 60 is formed over dielectric layer 56 and in the contact openings 58 in contact with the diffused regions 34, 38. Polysilicon layer 60 is preferably deposited as an in situ doped polysilicon being doped with a similar dopant as the diffused regions 34, 38. In this example, if the diffused regions 34, 38 are $N^+$, polysilicon layer 60 may be $N^+$ in situ doped polysilicon as deposited with sufficient doping level to reduce the contact resistance of this layer and provide an adequate electrical path to the diffused regions 34,38. In this example, the in situ doping level is approximately $10^{20}$ ions/cm$^3$ as formed. Polysilicon layer 60 will have a thickness on the order of between approximately 300 to 2000 angstroms. Alternatively, the polysilicon layer 60 may be doped after deposition, for example, by ion implantation or other suitable method. A single blanket implant may be done across the entire polysilicon layer or it may be masked in selected regions to allow for the non-selected regions to be counterdoped. Typically, doping concentrations of between $10^{19}$/cm$^3$ to $10^{22}$/cm$^3$ will be achieved.

Figure 6:
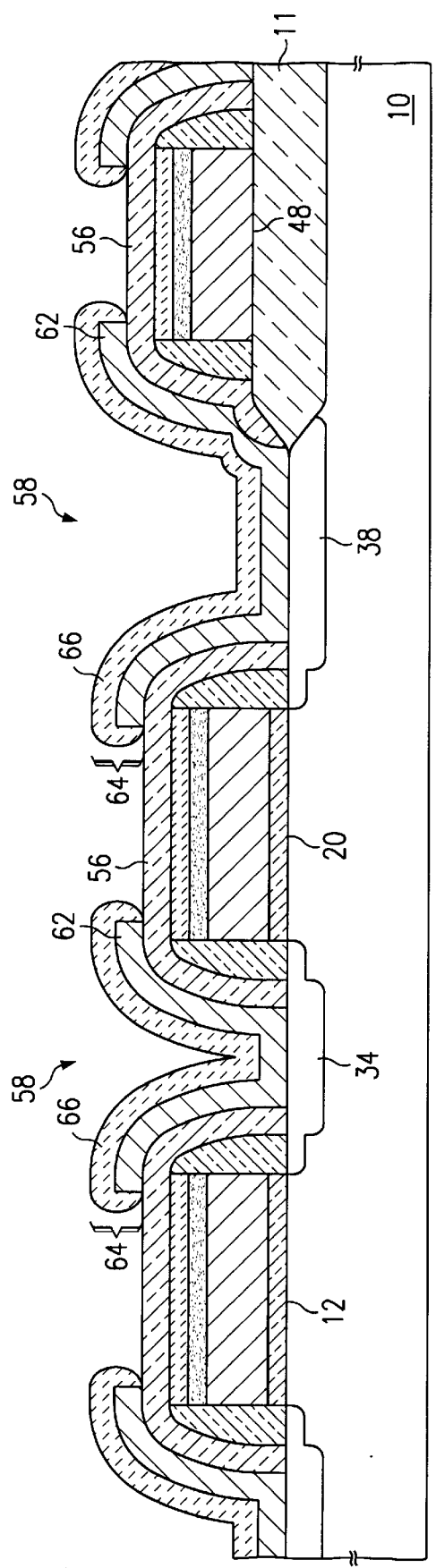

Referring to FIG. 6, polysilicon layer 60 is patterned and etched to form a conductive landing pad 62, which in this example extends into the openings 58 to the diffused regions 34, 38 and over a portion of the dielectric layer 56 adjacent the opening. Polysilicon landing pad 62 will provide for proper design rules for spacing such as that between the contact edge in openings 58 and edges of the gates 12, 20 and interconnect 48 required for smaller geometries. Some misalignment of the contact openings over the active regions 34, 38 will also be tolerated by the use of the polysilicon landing pad 62.

Once the polysilicon layer is patterned and etched to form the polysilicon landing pad, a conductive layer is to be formed over the landing pad which is both a good conductor and a good barrier, for example, to prevent aluminum/silicon interdiffusion between the substrate and an aluminum contact to be made to the substrate. In addition, the landing pad must be a good etch stop, that is, the etch chemistries must be selective between the landing pad and surrounding layers such as oxides. As noted above, refractory metal suicides typically formed over polysilicon to reduce sheet resistance are neither good barriers nor good etch stops. Polysilicon, with most etch chemistries, will etch faster than silicide. With variations in the topography across the wafer surface, when the silicide is etched, the polysilicon may also be etched in thinner regions. If the polysilicon is partially removed in certain areas, the next polysilicon etch will remove oxides underlying or adjacent to the polysilicon which have similar etch rates to that of the polysilicon. In the present application, a conductive layer is formed only on the polysilicon and is formed after the polysilicon has been etched. Thus, the etch step is simplified from a 2-layer etch to a 1-layer etch. The polysilicon is thus not overetched in the thinner regions, thereby reducing the possibility of etching the surrounding oxides.

Referring again to FIG. 6, tungsten is selectively deposited by chemical vapor deposition (CVD) to form a composite landing pad 64 comprising polysilicon landing pad 62 and selectively deposited tungsten 66. An important aspect of the present invention is the formation of tungsten layer 66 over the polysilicon landing pad 62. Tungsten over polysilicon will provide a low resistance conformal layer which will act as a good barrier to the aluminum/silicon interdiffusion problem and will act as a good etch stop. Tungsten is also a good electromigration resistant material. In addition, tungsten can be selectively deposited over the polysilicon landing pad and not the surrounding oxides. Selective tungsten deposition generally follows a two step process. It is first reduced by silicon to form a thin layer of tungsten over the polysilicon; approximately 100 angstroms. The silicon reduction is given by:

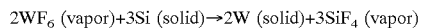
$$2WF_6 \text{ (vapor)} + 3Si \text{ (solid)} \rightarrow 2W \text{ (solid)} + 3SiF_4 \text{ (vapor)}$$

This reaction becomes self-limiting, that is, once the thin tungsten layer is formed, it becomes a diffusion barrier between the underlying silicon (Si), or in this case, the polysilicon and the tungsten hexaflouride ($WF_6$) vapor. The next step is a hydrogen reduction carried out under conditions which only allow the tungsten to deposit on the previously formed thin tungsten layer. The tungsten will not form on the oxide layer 56. The hydrogen reduction is given by:

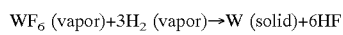
$$WF_6 \text{ (vapor)} + 3H_2 \text{ (vapor)} \rightarrow W \text{ (solid)} + 6HF$$

In the present application, it is preferable to deposit the tungsten at temperatures between approximately 200° C. to 700° C., more preferably 450° C., and within a pressure range of approximately 2–5 Torr. With a tungsten hexaflouride flow of approximately 90–100 sccm or less and an $H_2$ flow of approximately 600 sccm or greater, the resulting deposition thickness of tungsten layer 66 over polysilicon landing pad 62 should be between approximately 400 to 1000 angstroms. After deposition, an anneal may be done at approximately 850° C. in either a nitrogen or argon ambient which should make the tungsten stable up to approximately 1000° C. during subsequent processing steps.

Figure 7:
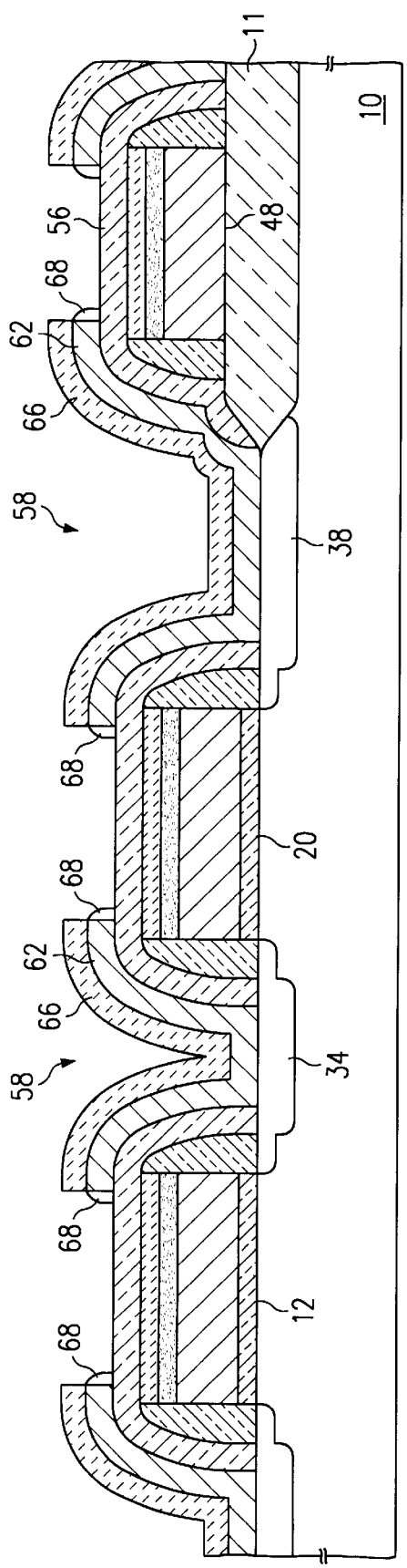

Referring to FIG. 7, if it is desired that no tungsten form along the ends of the polysilicon landing pad 62, a sidewall spacer 68 may be formed first along the ends of the polysilicon landing pad 62 by conventional methods. When tungsten is then selectively deposited, it will not form over the sidewall spacer 68 at the ends of the polysilicon landing pad 62. The sidewall spacers may typically be formed of oxide or nitride.

Figure 8:
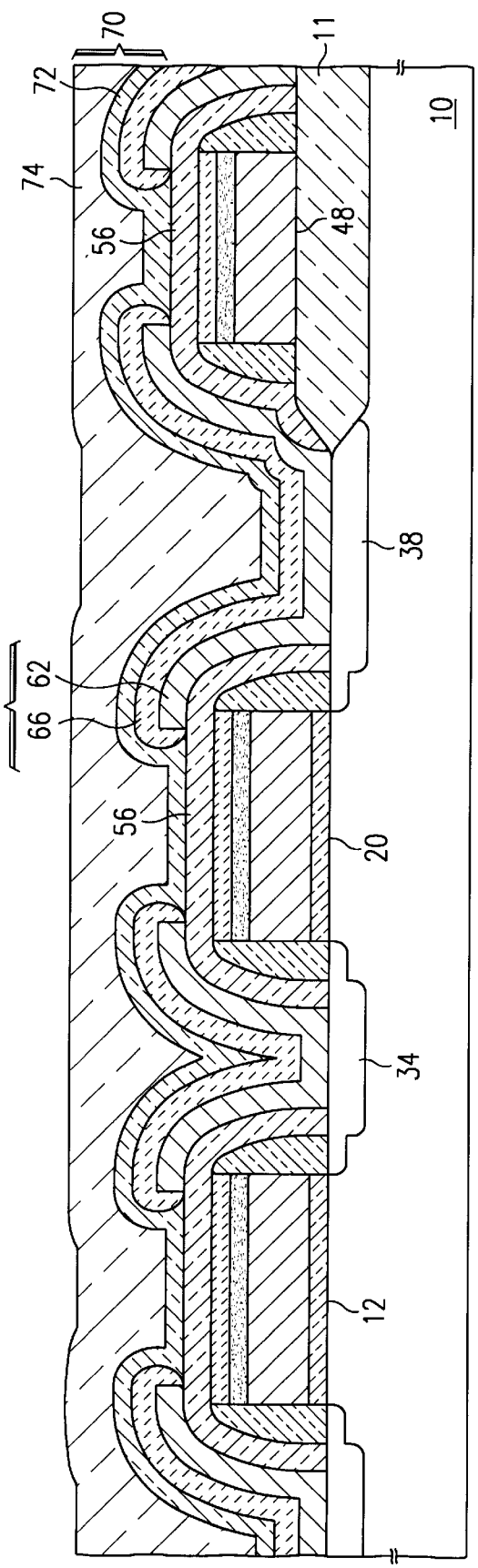

Referring to FIG. 8, subsequent process steps are shown. Reference will be made to the landing pad 64 as described above with reference to FIG. 6, however, it will be appreciated that these subsequent process steps may also follow from the composite landing pad 64 with sidewall spacers 68 as shown with reference to FIG. 7. A second dielectric layer 70 is formed over the landing pad 64 and first dielectric layer 56. The second dielectric layer 70 may be, for example, a multi-layer film or a glass layer such as spin-on-glass or borophosphorous silicate glass (BPSG) to aid in planarization of the surface of the wafer at this stage of processing. An example of a multi-layer film may be a thin undoped oxide 72 formed under a BPSG layer 74. The undoped oxide may aid in protecting areas of the chip during subsequent processing steps and in particular will help to prevent the BPSG layer from forming directly on active areas which may not be covered by the first dielectric layer 56. The dielectric layer 70 will have a thickness dependent upon the underlying topography and may be between approximately 3000 to 8500 angstroms.

Figure 9:
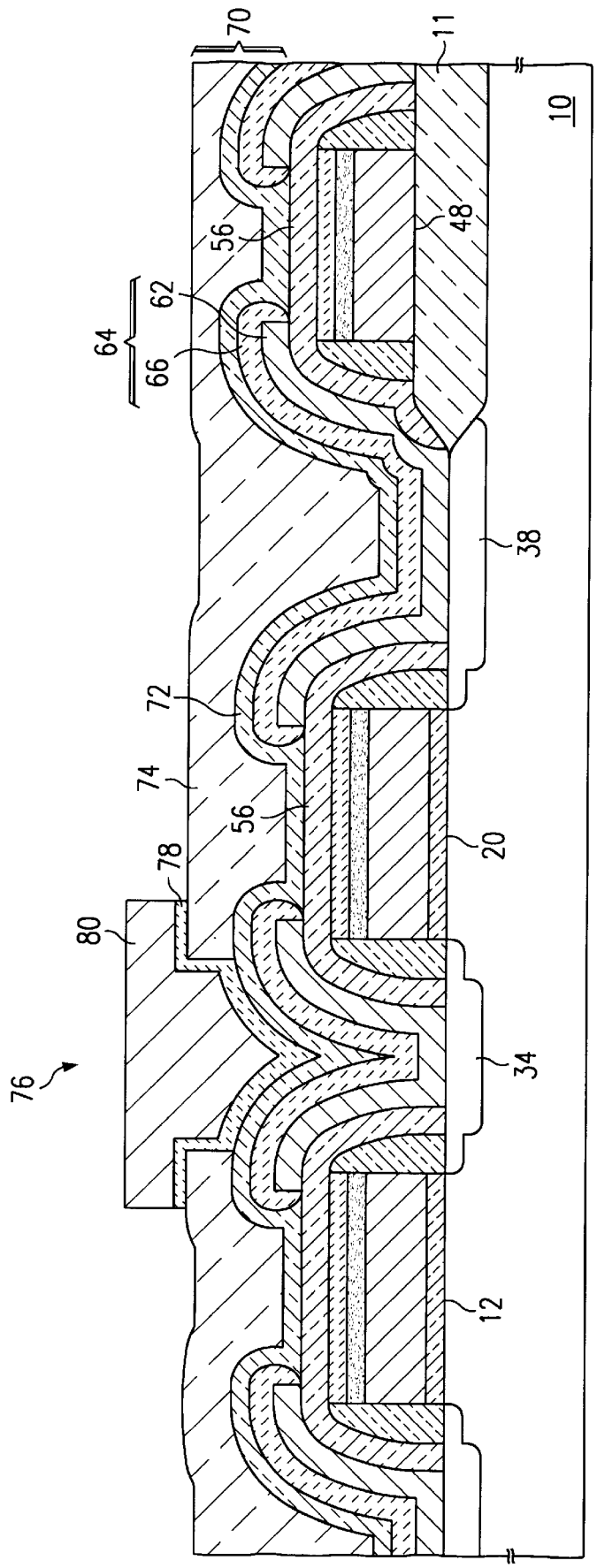

Referring to FIG. 9, an opening 76 is formed through the dielectric layer 70 (or oxide 72 and BPSG layer 74 if an multi-layer film is employed for dielectric layer 70) exposing a portion of the landing pad 64. If BPSG is used for the second dielectric layer 70, as is known in the art, it can be reflowed to round the corners at the opening 76. Only one opening 76 is shown here to the landing pad 64 overlying active area 34 in substrate 10 for ease of illustration. It will be appreciated, however, by those skilled in the art that contact opening 76 may be formed to expose any of the landing pad locations. A barrier layer 78 may be formed under a subsequently formed metal contact in opening 76 to reduce the well known wear out failure mechanisms referred to as stress induced migration and electromigration. The thin barrier layer 78 may be a refractory metal or refractory metal nitride any may be formed by way of sputtering or other suitable method, to a thickness of about 400 to 1000 angstroms. As is known in the art, barrier layer 78 is preferably formed of titanium nitride or other suitable refractory metal nitride, or may be formed of titanium, titanium-tungsten, or other suitable refractory metal. The barrier layer may alternatively be formed of a refractory metal nitride over a refractory metal, for example, a titanium nitride may be formed over a titanium layer. The material and thickness of barrier layer 78 are selected to optimize process conditions to prevent diffusion of atoms between an overlying conductive layer and the underlying polysilicon landing pad 64. However, one advantage of the present invention, with selective tungsten now at the bottom of the contact opening, the use of a barrier layer may be reduced or unnecessary since the tungsten will reduce any risk of aluminum spiking through the landing pad into the substrate. Fewer process steps at this stage will also result if the barrier layer 78 is not required. A conductive layer is formed over the barrier layer 78 in opening 76, patterned and etched to form a conductive contact 80. Contact 80 is typically an aluminum alloy as is known in the art.

Contact 80 makes electrical connection to diffused region 34, in this example, through composite landing pad 64. Any misalignment of the width and location of the contact opening 76 over the landing pad is not as critical as the previous contact opening 58 to diffused region 34. With the landing pad formed between the contact 80 and the active region 34, the design rules for contact to gate spacing are maintained. A wider and/or more shallow contact opening 80 over the landing pad 64 may thus be formed to facilitate the deposition of a contact metal such as aluminum or other suitable contact metal. The barrier layer, if necessary, will be able to form more uniformly along the sides and bottom of the contact opening and more particularly in the corners. In addition, some misalignment of contact opening 80 over the landing pad 64 will be tolerated without invalidating design rules, such misalignment of the contact opening 80 for a metal contact not being tolerated at the diffused region 34, in this example between transistors 12, 20.

A composite tungsten/polysilicon landing pad has the advantage of enhancing conductivity while providing both a good barrier to aluminum/silicon interdiffusion and a good etch stop.

While the invention has been described herein relative to its preferred embodiments, it is of course contemplated that modifications of, and alternatives to , these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a landing pad structure in an integrated circuit, comprising:

forming an active region within a substrate;

forming a gate oxide over the substrate adjacent the active region;

forming a polysilicon gate electrode over the rate oxide;

forming a silicide over the gate electrode;

forming sidewall spacers adjacent the gate oxide, the gate electrode, and the silicide;

forming polysilicon landing pad adjacent the gate electrode and contacting the active region;

selectively depositing tungsten on the polysilicon landing pad to form a composite polysilicon/tungsten layer on an upper surface of the landing pad;

forming a dielectric layer over the landing pad having an opening therethrough exposing a portion of the composite polysilicon/tungsten layer; and forming a conductive contact in the opening through the dielectric layer contacting the composite polysilicon/tungsten layer.

2. The method of claim 1, wherein the step of forming a conductive contact in the opening through the dielectric layer contacting the composite polysilicon/tungsten layer further comprises:

forming the conductive contact without a barrier layer in the opening underlying the conductive contact.

3. A method of forming a portion of a semiconductor integrated circuit, comprising the steps of:

forming a plurality of conductive regions, wherein at least one conductive region comprises an active region in a substrate adjacent a gate electrode;

forming a doped polysilicon layer over the integrated circuit;

patterning and etching the polysilicon layer to form a polysilicon landing pad over the active area and a portion of the gate electrode;

selectively depositing tungsten on the polysilicon landing pad to form a composite doped polysilicon/tungsten layer over an entire upper surface of the polysilicon landing pad; and after forming the composite polysilicon/tungsten layer, forming a dielectric layer over the landing pad, the dielectric layer overlying outer portions of the landing pad and having an opening therethrough over an inner portion of the landing pad, wherein the opening is over a portion of the composite polysilicon/tungsten layer.

4. The method of claim 3, wherein the step of selectively depositing tungsten on the polysilicon landing pad to form a composite polysilicon/tungsten layer further comprises:

forming a substantial barrier to any aluminum/silicon interdiffusion.

5. The method of claim 3, wherein the step of selectively depositing tungsten on the polysilicon landing pad to form a composite polysilicon/tungsten layer further comprises:

forming an etch stop layer for limiting the step of etching an opening through the dielectric layer.

6. The method of claim 3, wherein the composite polysilicon/tungsten layer has a thickness on the order of between approximately 700 to 3000 angstroms.

7. The method of claim 3, further comprising the step of:

forming a sidewall spacer adjacent ends of the polysilicon landing pad before the selective tungsten deposition.

8. The method of claim 3, further comprising the step of:

annealing the landing pad before the dielectric layer is formed.

9. The method of claim 8, wherein the annealing step is performed at approximately 850° C.

10. The method of claim 8, wherein the annealing step is performed in a nitrogen ambient.

11. The method of claim 8, wherein the annealing step is performed in an argon ambient.

12. A method of forming a landing pad structure in an integrated circuit, comprising:

forming a transistor including an active region within a substrate, a gate oxide over the substrate adjacent the active region, a gate electrode over the gate oxide, and sidewall spacers adjacent the gate oxide and the gate electrode;

forming polysilicon landing pad adjacent the gate electrode overlying a portion of the sidewall spacers and contacting the active region;

selectively depositing tungsten on the polysilicon landing pad to form a composite polysilicon/tungsten layer on an upper surface of the landing pad;

forming a dielectric layer over the landing pad and surrounding regions; and etching an opening through the dielectric layer exposing a portion of the composite polysilicon/tungsten layer.

13. The method of claim 12, further comprising:

forming a conductive contact in the opening directly contacting the exposed portion of the composite polysilicon/tungsten layer.

14. The method of claim 13, wherein the step of forming a conductive contact in the opening directly contacting the exposed portion of the composite polysilicon/tungsten layer further comprises:

forming the conductive contact in the opening without a barrier layer underlying the conductive contact.

15. The method of claim 12, wherein the step of etching an opening through the dielectric layer exposing a portion of the composite polysilicon/tungsten layer further comprises:

selectively etching the dielectric layer with respect to the composite polysilicon/tungsten layer.

16. The method of claim 12, wherein the step of etching an opening through the dielectric layer exposing a portion of the composite polysilicon/tungsten layer further comprises:

etching the opening through the dielectric layer over a central portion of the composite polysilicon/tungsten layer, leaving the dielectric layer on peripheral portions of the composite polysilicon/tungsten layer.

17. The method of claim 12, wherein the step of selectively depositing tungsten on the polysilicon landing pad to form a composite polysilicon/tungsten layer on an upper surface of the landing pad further comprises:

forming the composite polysilicon/tungsten layer with a thickness of between 700 and 3000 angstroms.

* * * * *